United States Patent [19]
Nishimaki

[11] Patent Number: 5,384,732
[45] Date of Patent: Jan. 24, 1995

[54] SEMICONDUCTOR DEVICE COMPRISING A FUNCTION CHANGE OVER SWITCHING CIRCUIT HAVING A NON-VOLATILE STORAGE DEVICE

[75] Inventor: Tatsuo Nishimaki, Nagano, Japan

[73] Assignee: Seiko Epson Corporation, Tokyo, Japan

[21] Appl. No.: 82,090

[22] Filed: Jun. 24, 1993

[30] Foreign Application Priority Data

Jul. 3, 1992 [JP] Japan ............................ 4-176368
Jun. 21, 1993 [JP] Japan ............................ 5-149484

[51] Int. Cl.⁶ .......................................... H03K 19/177
[52] U.S. Cl. ............................ 365/185; 365/189.02; 326/37
[58] Field of Search ............ 369/24; 340/825.22, 340/825.15, 825.03, 825.09; 358/194.1; 307/440, 445, 450, 465; 365/185, 230.02, 189.02

[56] References Cited

U.S. PATENT DOCUMENTS

| | | | |
|---|---|---|---|
| 4,823,320 | 4/1989 | Smayling et al. | 365/185 |
| 4,930,097 | 5/1990 | Ledenbach et al. | 307/465 |
| 4,963,769 | 10/1990 | Hiltpold et al. | 307/465 |
| 4,969,121 | 11/1990 | Chan et al. | 307/465 |
| 5,247,213 | 9/1993 | Trinh et al. | 307/465 |

FOREIGN PATENT DOCUMENTS

63260319 10/1988 Japan .................. 307/445

*Primary Examiner*—Eugene R. LaRoche
*Assistant Examiner*—Vu Le
*Attorney, Agent, or Firm*—Ladas & Parry

[57] ABSTRACT

A semiconductor device in which not only mask options of a mask ROM can be provided in the form of a PROM but the chip size can be reduced, and an electronic appliance using the same. The semiconductor device comprises a nonvolatile storage device (12) writable electrically, and switching circuits (18, 20) controlled on the basis of data stored in the nonvolatile storage device to perform wiring switching. Because wirings A, B1 and B2 are switched on the basis of data stored in the nonvolatile storage device, for example, optional functions of a one-chip micro computer can be provided in the form of a PROM by using the wiring switching.

10 Claims, 8 Drawing Sheets

SEMICONDUCTOR DEVICE COMPRISING A FUNCTION CHANGE OVER SWITCHING CIRCUIT HAVING A NON-VOLATILE STORAGE DEVICE

BACKGROUND OF THE INVENTION

The present invention relates to a semiconductor device in which operation functions can be changed over through switches.

A one-chip micro computer generally has a configuration in which a central processing unit (hereinafter referred to as "CPU"), a read only memory (hereinafter referred to as "ROM"), a random access memory (hereinafter referred to as "RAM") and an input/output device (hereinafter referred to as "I/O") are formed on one and the same semiconductor substrate. In recent years, this type one-chip micro computer has been required to have a large number of functions. On the other hand, this type one-chip micro computer has been required to have various optional functions in accordance with the diversification of interfaces with peripheral devices and the diversification of specifications demanded by users. As a method in which optional functions capable of being changed over through certain switches are incorporated in this type one-chip microcomputer, there is a method in which registers corresponding to such optional functions are provided so that the functions can be switched by changing data of the registers. In this method, however, it is necessary that registers and address decoders are provided correspondingly to the large number of optional functions. Accordingly, this type one-chip micro computer must have a large number of registers unnecessarily, so that increase of chip size and increase of chip cost cannot be avoided. Upon such circumstances, conventionally, such optional functions as used after fixed by users are formed simultaneously in the same semiconductor device producing process in which data of a program ROM are formed.

On the other hand, in order to develop data of the program ROM for this type one-chip micro computer and in order to evaluate the data in the condition that the program ROM is mounted on this type one-chip micro-computer, a PROM built-in micro computer formed by replacing the ROM by a PROM is used as a test IC. In such a PROM built-in micro computer, there may arise a disadvantage in that the operation of a test IC is different from the operation of a real IC, because it is impossible to switch the above-mentioned optional functions in the case where the functions are provided in the form of mask options. Further, in the present state, such a PROM built-in micro computer formed by providing a mask ROM in the form of a PROM is indispensable to perform development of program data of the mask ROM type.

As described above, the PROM built-in micro computer is mainly used for development. Accordingly, in a one-chip micro computer including a plurality of mask options, it is important that compatibility between the mask ROM type and the PROM type is secured for development of program data. Accordingly, in the PROM type, it is necessary that the mask options are provided in the form of a PROM. The mask options are however arranged dispersively in the IC. Accordingly, in a general method in which data are written in a PROM so that one data is allocated to one address correspondingly, increase of chip size cannot be avoided because address signals, data signals, address decoder signals and write control signals are drawn around within the chip.

SUMMARY OF THE INVENTION

An object of the present invention is to provide a semiconductor device in which not only mask options of a mask ROM can be provided in the form of a PROM, but the chip size can be reduced, and also to provide an electronic appliance using the semiconductor device.

According to an aspect of the present invention, the semiconductor device comprises a nonvolatile storage device which is electrically writable, and a switching circuit which is controlled on the basis of data stored in the nonvolatile storage device so as to perform wiring switching. Because wiring switching is performed on the basis of data stored in the nonvolatile storage device, for example, optional functions of a one-chip micro computer can be provided in the form of a PROM by using such wiring switching.

According to another aspect of the present invention, in the semiconductor device, the switching circuit includes at least two transmission gates so that wiring switching is performed by opening one of the transmission gates. Because the switching circuit is constituted by transmission gates, not only digital signals but analog signals can be sent out after switched.

According to a further aspect of the present invention, in the semiconductor device, the switching circuit includes at least two clocked gates so that wiring switching is performed by opening one of the clocked gates.

According to a still further aspect of the present invention, in the semiconductor device, the switching circuit includes at least two NAND gates so that wiring switching is performed by opening one of the NAND gates.

According to another aspect of the present invention, in the semiconductor device, the switching circuit includes at least two NOR gates so that wiring switching is performed by opening one of the NOR gates.

In the present invention, of the above-mentioned gates, switching elements, such as clocked gates, NAND gates or NOR gates, suited to optional functions are selectively used so that digital signals or the like can be sent out after switched on the basis of wiring switching through the gates.

According to a further aspect of the present invention, in the semiconductor device, the nonvolatile storage device includes a nonvolatile element writable electrically, a write control circuit for writing data in the nonvolatile element, and a data holding circuit for reading data written in the nonvolatile element and for holding the data. Writing of data in the nonvolatile element is performed by the write control circuit, so that the data written in the nonvolatile element is read and held by the data holding circuit. Further, the switching circuit is switched on the basis of the data held by the data holding circuit.

According to a still further aspect of the present invention, the semiconductor device further comprises a stored data output circuit for reading data written in the nonvolatile element in order to check the data. The data written in the nonvolatile element is read through the stored data output circuit, so that checking can be made as to whether a desired data is written in the nonvolatile element or not.

According to another aspect of the present invention, the semiconductor device further comprises a transfer register for receiving write data as input data and for delivering the data as output data to the nonvolatile storage device in predetermined timing. Write data is inputted into the nonvolatile storage device through the transfer register so as to be written in the nonvolatile storage device.

According to a further aspect of the present invention, the semiconductor device comprises a plurality of function changeover switches, each of which includes a transfer register for receiving write data as input data and for sending out the data as output data in predetermined timing, a nonvolatile storage device electrically writable and for storing data received from the transfer register, a switching circuit controlled on the basis of data stored in the nonvolatile storage device to perform wiring switching, and a stored data output circuit for reading data written in the nonvolatile storage device in order to check the data. By connecting the transfer registers in series, the plurality of function changeover switches are connected in series. Write data are successively shifted through the transfer registers of the function changeover switches in the condition that the plurality of function changeover switches are connected in series. At the point of time of completion of shifting of respective desired data to the transfer registers, the data are written in the nonvolatile storage device. Because option data to be written in the nonvolatile storage device are transferred serially through the transfer registers, unnecessary wirings can be prevented from being drawn around within the IC. As a result, chip size can be reduced.

According to a still further aspect of the present invention, in the semiconductor device, the function changeover switches are provided on a one-chip micro computer including an ROM, an RAM, a CPU and an I/O which are formed on one semiconductor substrate. The switching circuits make respective switching operations on the bass of data written in the nonvolatile storage device of the function changeover switches, so that wiring switching is performed. By the switching operations of the switching circuits, switching of the signal to be outputted to the output port, switching of the clock to be supplied to the peripheral circuits, on/-off operation of the pull-up resistor of the input port, etc., are performed. That is, functions of the one-chip micro computer are switched on the basis of the switching operations of the function changeover switches. In the semiconductor device having the above-mentioned configuration, optional functions of a one-chip micro computer are provided in the form of a PROM so that it is made possible that the optional functions can be switched by performing writing into the PROM from the outside of the IC.

According to another aspect of the present invention, the electronic appliance comprises a semiconductor device including a plurality of function changeover switches connected in series, each of the function changeover switches having a transfer register for receiving write data as input data and for sending out the data as output data in predetermined timing, a nonvolatile storage device electrically writable and for storing data received from the transfer register, a switching circuit controlled on the basis of data stored in the nonvolatile storage device to perform wiring switching, and a stored data output circuit for reading data written in the nonvolatile storage device in order to check the data.

According to a further aspect of the present invention, in the electronic appliance, the function changeover switches are provided on a one-chip micro computer including an ROM, an RAM, a CPU and an I/O which are formed on one semiconductor substrate. The switching circuits make switching operations on the basis of data written in the nonvolatile storage device of the function changeover switches, so that wiring switching is performed. By the switching operations of the switching circuits, switching of the signal to be outputted to the output port, switching of the clock to be supplied to the peripheral circuits, on/off operation of the pull-up resistor of the input port, etc., are performed. Thus, functional operations of a one-chip micro computer can be switched on the basis of the switching operations of the function changeover switches.

The above and other objects as well as advantageous features of the invention will become more clear from the following description taken in conjunction with the drawings.

DESCRIPTION OF THE PREFERRED EMBODIMENTS

Figure 1:
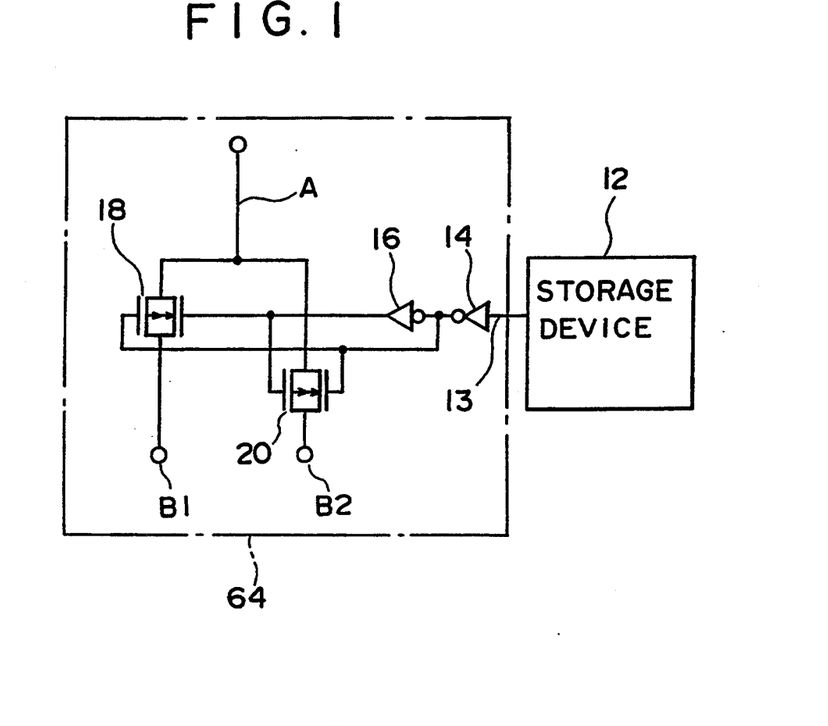
FIG. 1 is a circuit diagram of a switching circuit using transmission gates in a semiconductor device as an embodiment of the present invention.

FIG. 1 is a block diagram showing the configuration of a semiconductor device as an embodiment of the present invention. A nonvolatile storage device (hereinafter merely called "storage device") 12 in which optional function switching data are stored is connected to respective gate terminals of transmission gates 18 and 20 through inverters 14 and 16. The transmission gate 18 is a gate for connecting a signal line B1 to a signal line A. The transmission gate 20 is a gate for connecting a signal line B2 to the signal line A. When one and the other of the transmission gates 18 and 20 are switched on and off respectively on the basis of an optional function switching data 13 stored in the storage device 12, only one of the signal lines B1 and B2 is connected to the signal line A. Thus, wiring switching from the signal line B1 or B2 to the signal line A is performed, so that optional function switching is performed. In this embodiment, connection and/or switching of a signal such as an analog signal can be made because wiring switching is performed through the transmission gates 18 and 20.

Figure 2:
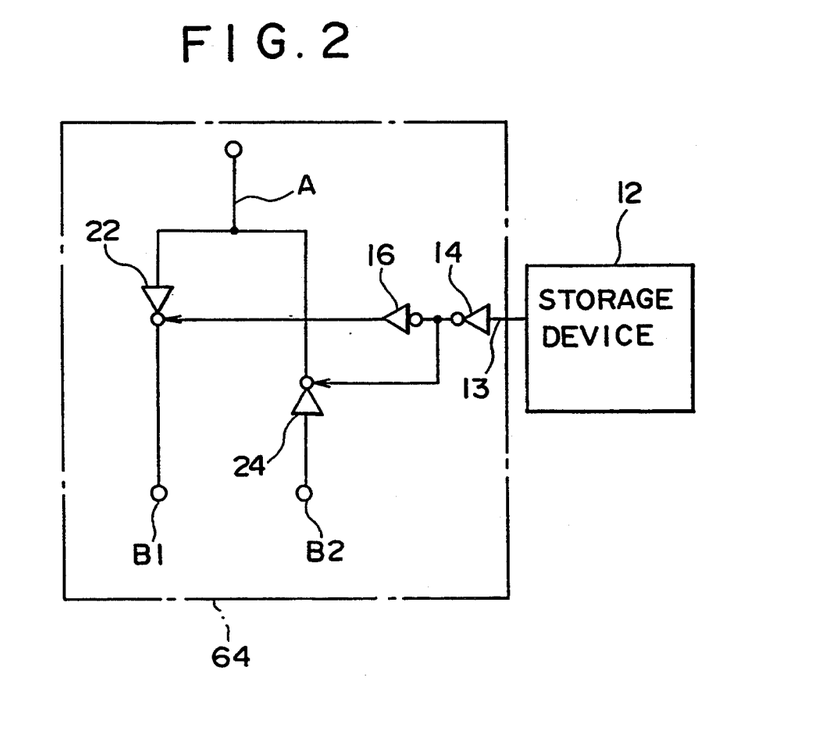
FIG. 2 is a circuit diagram of a switching circuit using clocked gates in a semiconductor device as another embodiment of the present invention.

FIG. 2 is a block diagram showing the configuration of a semiconductor device as another embodiment of the present invention. In this embodiment, the storage device 12 is connected to clocked gates 22 and 24 through inverters 14 and 16. The clocked gate 22 is a gate for connecting a signal line B1 to a signal line A. The clocked gate 24 is a gate for connecting a signal line B2 to the signal line A. When one and the other of the clocked gates 22 and 24 are switched on and off respectively on the basis of an optional function switching data 13 stored in the storage device 12, only one of the signal lines B1 and B2 is connected to the signal line A in the same manner as in the above-mentioned embodiment. Thus, wiring switching from the signal line B1 or B2 to the signal line A is performed, so that optional function switching is performed. If the clocked gates 22 and 24 are respectively connected in directions reverse to the directions of FIG. 2, a signal can be transmitted from the signal line A to the signal line B1 or B2.

Figure 3:
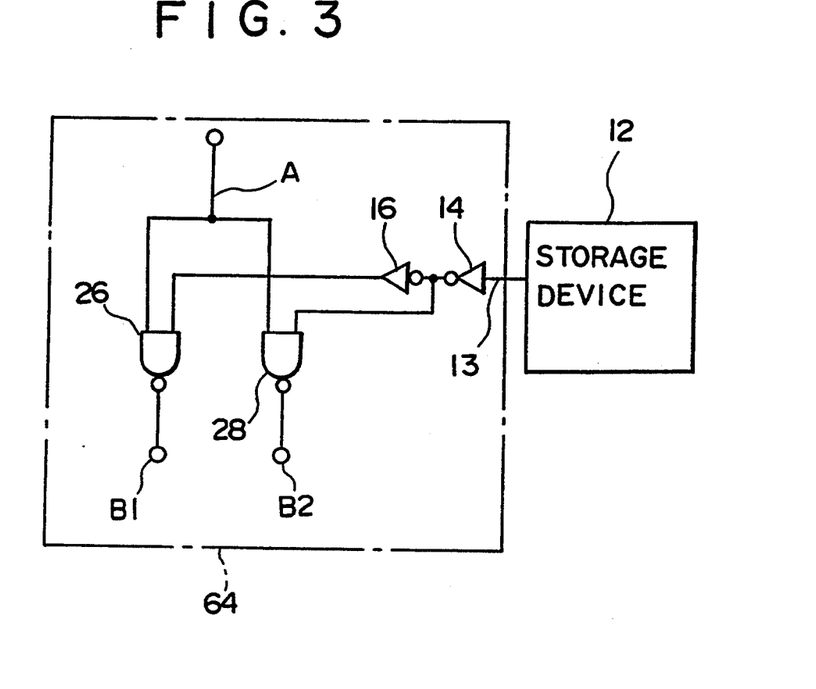
FIG. 3 is a circuit diagram of a switching circuit using NAND gates in a semiconductor device-as a further embodiment of the present invention.

FIG. 3 is a block diagram showing the configuration of a semiconductor device as a further embodiment of the present invention. In this embodiment, the storage device 12 is connected to NAND gates 26 and 28 through inverters 14 and 16. The NAND gate 26 is a gate for connecting a signal line A to a signal line B1. The NAND gate 28 is a gate for connecting the signal line A to a signal line B2. When one and the other of the NAND gates 26 and 28 are opened and closed respectively on the basis of an optional function switching data 13 stored in the storage device 12, only one of the signal lines B1 and B2 is connected to the signal line A in the same manner as in the above-mentioned embodiment. Thus, wiring switching from the signal line A to the signal line B1 or B2 is performed, so that optional function switching is performed. In this embodiment, an inverted signal of the signal line A is outputted to one of the signal lines B1 and B2 through corresponding one of the NAND gates 26 and 28 to thereby perform wiring switching. Accordingly, because the output of the other signal line B1 or B2 which is not selected becomes high ("H"), the situation of high impedance as in the case of clocked gates or in the case of transmission gates can be avoided. Accordingly, the situation that gates may be floating at the next stage, which would be caused in the clocked gates and transmission gates, can be avoided.

Figure 4:
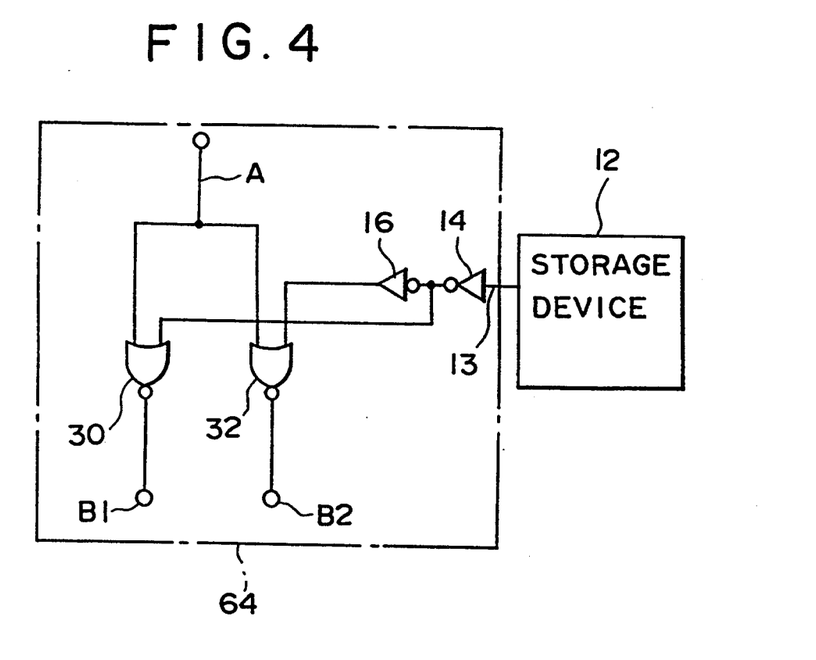
FIG. 4 is a circuit diagram of a switching circuit using NOR gates in a semiconductor device as a still further embodiment of the present invention.

FIG. 4 is a block diagram showing the configuration of a semiconductor device as a further embodiment of the present invention. In this embodiment, the NAND gates 26 and 28 used in the embodiment of FIG. 3 are replaced by NOR gates 30 and 32. In this embodiment, the semiconductor device operates in the same manner as that in the embodiment of FIG. 3, but the output of the signal line B1 or B2 not selected is fixed to be low ("L").

Figure 5:
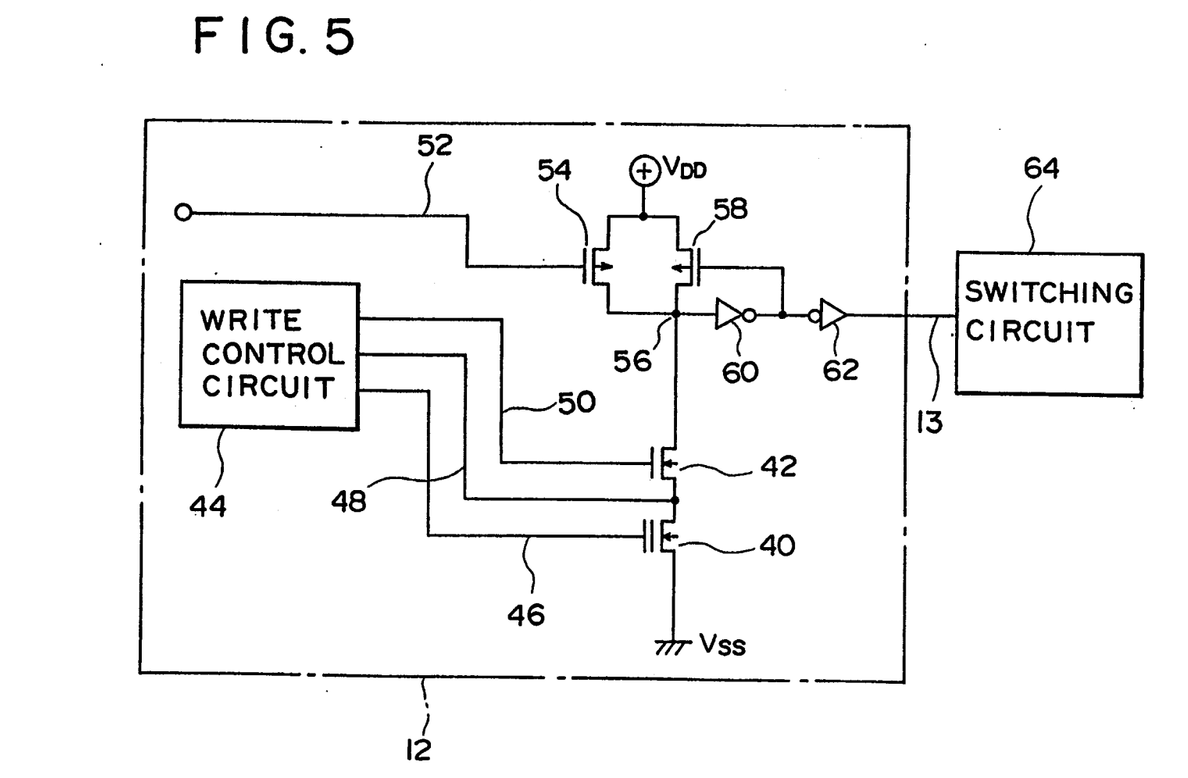
FIG. 5 is a circuit diagram of a storage device in a semiconductor device as another embodiment of the present invention.

FIG. 5 is a circuit diagram showing an embodiment of the storage device 12 depicted in FIGS. 1 through 4. In the drawing, an FAMOS 40 is a writable storage element which is connected in series to a high withstanding-voltage N-channel transistor 42. The high withstanding-voltage N-channel transistor 42 is a transistor for protecting an ordinary transistor from a high voltage supplied at the time of writing of data in the FAMOS 40. The FAMOS 40 and the high withstanding-voltage N-channel transistor 42 are controlled by a write control circuit 44. An FAMOS gate control signal 46 outputted from the write control circuit 44 is a control signal for controlling the gate voltage of the FAMOS 40 at the time of data writing. The level of this signal is "H" at the time of normal operation. Further, a write voltage 48 is a voltage supplied to the drain of the FAMOS 40 at the time of data writing, and a high withstanding-voltage transistor control signal 50 is a control signal for controlling the gate of the high withstanding-voltage N-channel transistor 42 at the time of data writing.

When data are to be written in the FAMOS 40, the write control circuit 44 controls the FAMOS gate control signal 46, the write voltage 48 and the high withstanding-voltage transistor control signal 50 as follows. The level of the FAMOS gate control signal 46 is switched from "H", for example, to 21 V. The level of the write voltage 48 is switched to a high voltage level of about 12.5 V. The level of the high withstanding-voltage transistor control signal 50 is switched to "L". By such controlling, data are written in the FAMOS 40 while the high withstanding-voltage N-channel transistor 42 is switched off so as to be blockaded. By the blockade of the high withstanding-voltage N-channel transistor 42, it can be avoided that the high voltage supplied to the FAMOS 40 is supplied to other transistors and the like.

The data thus stored on the basis of the above-mentioned control signals can be read when a P-channel transistor 54 is turned on through an optional function changeover data initialization signal 52. The capacity of the P-channel transistor 58 at this point of time is set so as to be sufficiently smaller than the capacity in the case where the transistor is switched on under the condition that the threshold of the FAMOS 40 is kept low (that is, the capacity in the case where writing is not being performed). Accordingly, the potential level at a point 56 is "H" at the time of switching-on of the P-channel transistor 54 in the case of data initialization is "H". In the case where the threshold of the FAMOS 40 is low (in the case where the writing is not being performed), however, the potential level at the point 56 becomes "L" when the P-channel transistor 54 is turned off after initialization so that the P-channel transistor 58 is turned off to fix the potential level at the point 56 to "L". On the contrary, in the case where threshold of the FAMOS 40 is high (that is, in the case where writing has been performed), the potential level at the point 56 becomes "H" even if the P-channel transistor 54 is turned off after initialization so that the P-channel transistor 58 is turned on to fix the potential level at the point 56 to "H".

Thus, the information of the potential of the point 56 is latched by a P-channel transistor 58 connected in parallel to the P-channel transistor 54. That is, the potential information of the point 56 is supplied to the gate of the P-channel transistor 58 through an inverter 60 so that the information is latched. The thus latched potential information of the point 56 is inputted into a switching circuit 64 through inverters 60 and 62. The switching circuit 64 is constituted by any one of the above-mentioned circuits surrounded by the broken line in FIGS. 1 through 4. In the switching circuit 64 as shown in FIGS. 1 through 4, output switching is performed on the basis of the latched potential information of the point 56.

Figure 6:
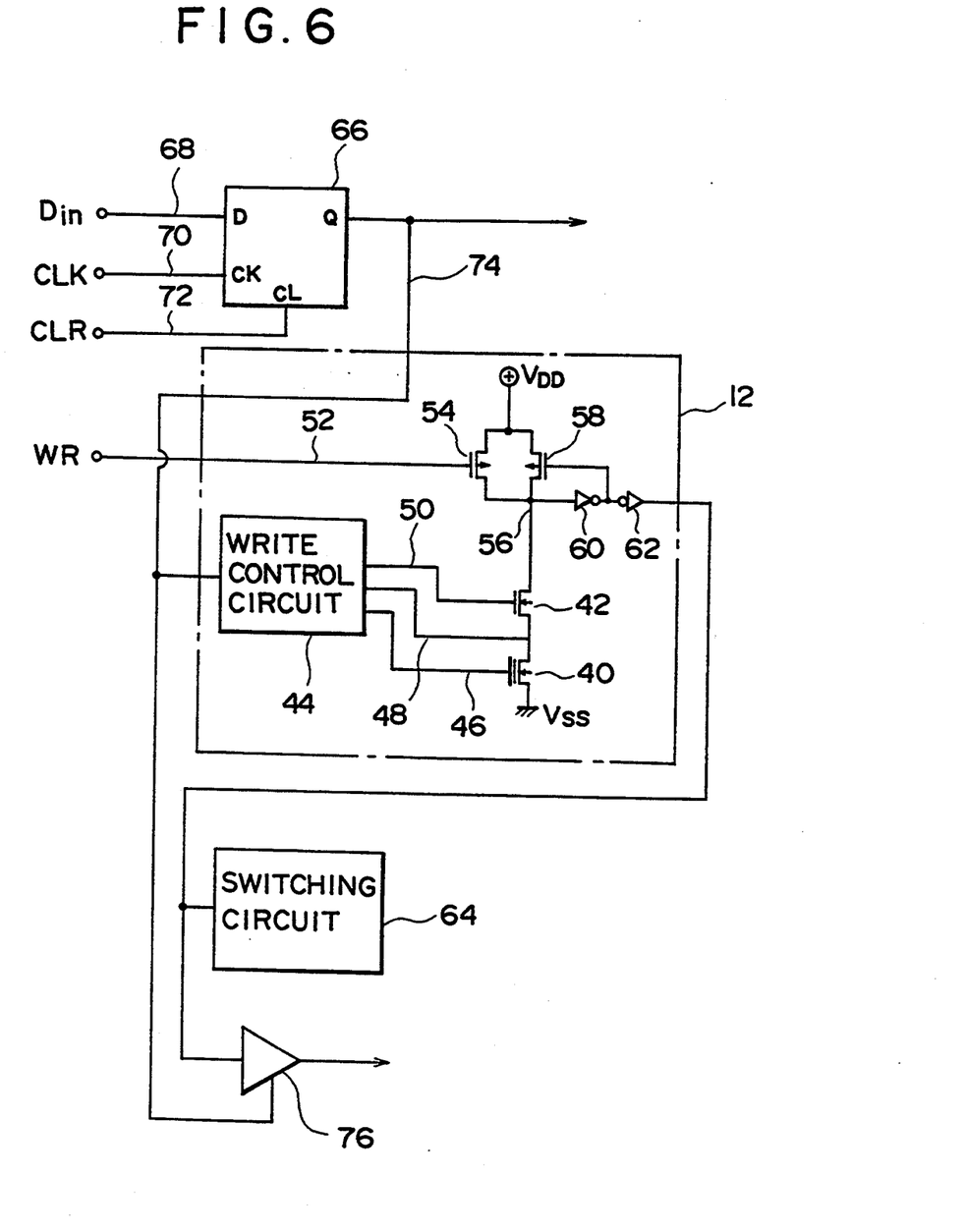
FIG. 6 is a block diagram showing the configuration of a function changeover switch in a semiconductor device as a further embodiment of the present invention.

FIG. 6 is a block diagram showing the configuration of a function changeover switch as an embodiment of the present invention. This embodiment is obtained by adding a switching data transfer circuit and a stored-data output circuit to the above-mentioned switching circuit 64 and the storage device 12. As shown in FIG. 6, a function switching data signal 68, a data transfer clock signal 70 and a register clear signal 72 are inputted into a transfer register 66 which serves to transfer data in order to switch option functions, so that a data signal 74 is outputted from the transfer register 66. The data signal 74 is supplied to the storage device 12 so that the above-mentioned operation is carried out. As a result, write data are read on the basis of the write signal 52 so as to be supplied to the switching circuit 64 and a clocked gate 76. The switching circuit 64 performs output switching on the basis of the data. The clocked gate 76 outputs the write data in response to inputting of the data 74. As a result, the contents of the write data are checked.

Figure 7:
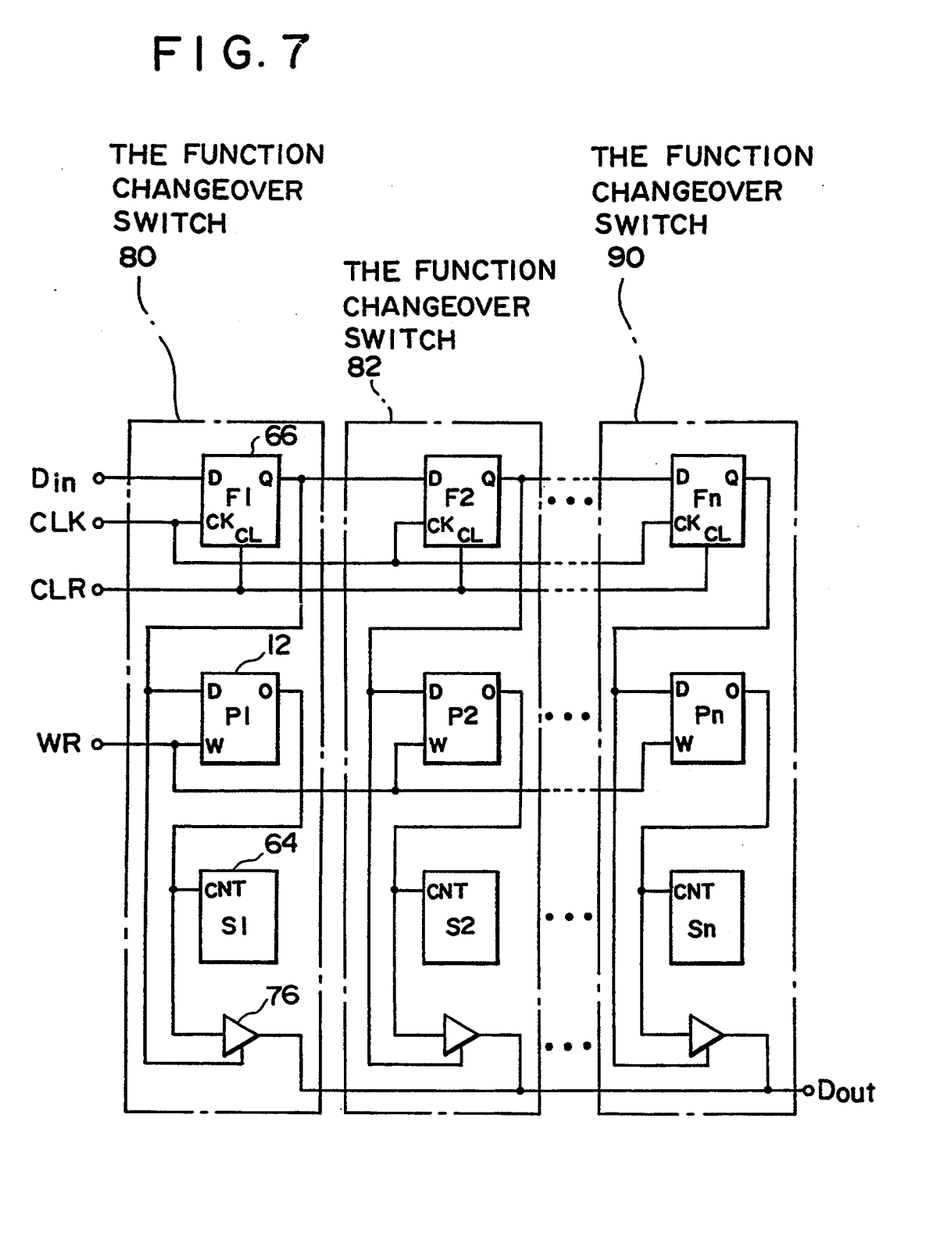
FIG. 7 is a block diagram of a semiconductor device provided with series-connected function changeover switches of the same type as that depicted in FIG. 6.
Figure 8:
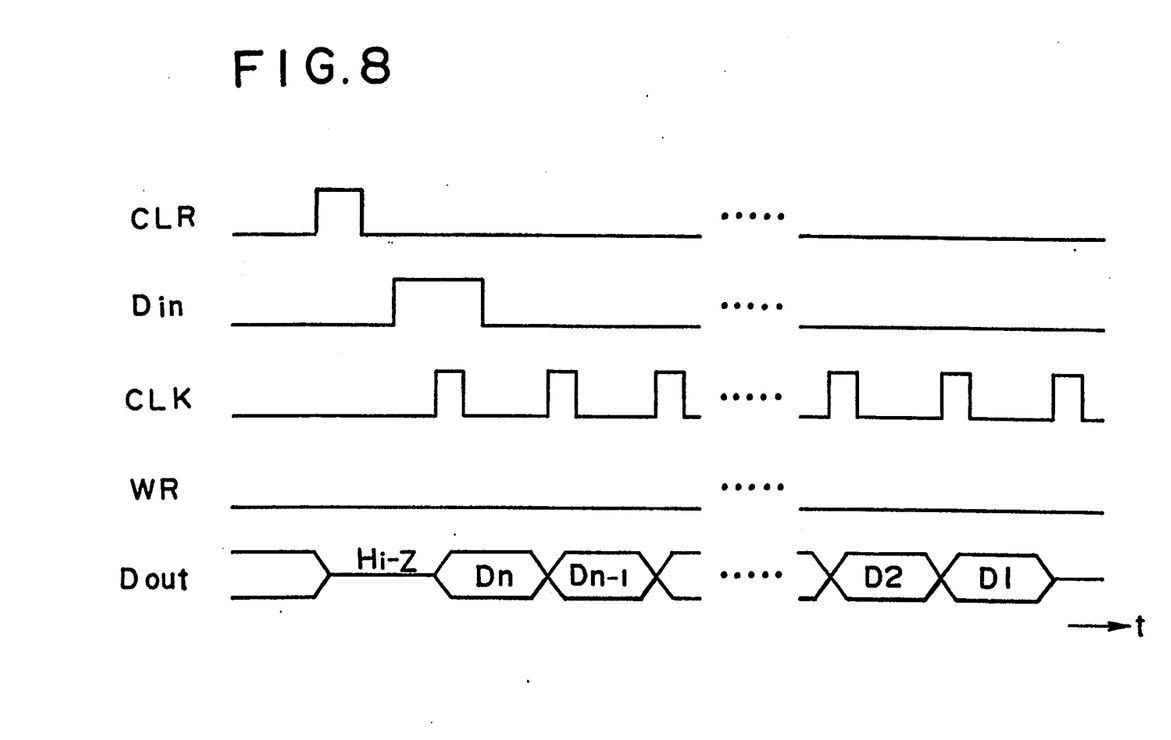
FIG. 8 is a timing chart showing the operation of the circuit of FIG. 7.

FIG. 7 shows a circuit formed by series-connecting function changeover switches 80, 82,..., 90 of the same as shown in FIG. 6. FIG. 8 is a timing chart showing the operation of the circuit of FIG. 7. As shown in FIG. 7, transfer registers 66 are connected in series. As shown in FIG. 7, a switching circuit 64, a storage device 12 and a clocked gate 76 are connected to each of the transfer registers 66 (F1 to Fn). At the point of time of turning-on of an electric source for the circuit of FIG. 7, the output level of each of the transfer registers 66 is unknown because there is no judgment as to whether the level is "H" or "L". Therefore, first the clear signal 72 of the "H" level is supplied to a CLR input terminal for a predetermined period to thereby initialize the inside of each of the transfer registers 66, that is, turn the level of the Q output 74 of each of the transfer registers 66 to "L". In this condition, all the levels of the Q outputs 74 of the transfer registers 66 (F1 to Fn) are "L" and the Q outputs 74 serve as control inputs of the clocked gates 76, respectively. Accordingly, an output terminal Dout obtained by cascade-connection of outputs of the clocked gates 76 is in a high impedance state.

When the clock signal 70 is inputted to an input terminal CLK while the data 68 of the "H" level is inputted to a data input terminal Din, the data is latched in the transfer register 66 (F1) so that the level of the Q output 74 of the transfer register 66 (F1) is turned to "H". As a result, the clocked gate 76 having a control input connected to the Q output 74 is turned on so that a signal of the same logical level as the data written in the storage device 12 is outputted from the clocked gate 76 to the output terminal Dout. In the case of writing of serial data, a shifting operation is n-times repeated successively so that the first input data and the last input data are regarded as $D_1$ and $D_n$ respectively. As a result, $D_n$ is latched in the first-stage data transfer register 66 (F1), and $D_1$ is latched in the last-stage data transfer register 66 (Fn). Thus, the data latched in the data transfer registers 66 can be taken out in a batch of data so as to be written in the storage device 12. Accordingly, it is apparent that the data outputted through the output terminal Dout at the point of time of completion of normal data writing is identical with the last data $D_n$.

When the situation is changed from this condition so that clock pulses 70 are successively inputted to the clock input terminal CLK while the level of the data 68 is kept "L", data $D_{n-1}$, $D_{n-2}$, $D_{n-3}$, ... are successively outputted through the output terminal. That is, when the n-th clock pulse is inputted to the terminal CLK, $D_1$ identical with the first write data is outputted. When the number of the input clock pulses 70 exceeds n, all the levels of the Q outputs 74 of the data transfer registers 66 are turned to "L". As a result, all the clocked gates 76 connected to the Q outputs 74 are turned off so that the output of the output terminal Dout falls in a high impedance state.

Although the above-mentioned embodiment has shown a method of reading PROM data through clocked gates, it is a matter of course that the stored data output circuit used in the present invention can be constituted by transmission gates or other semiconductor switching elements.

Figure 9:
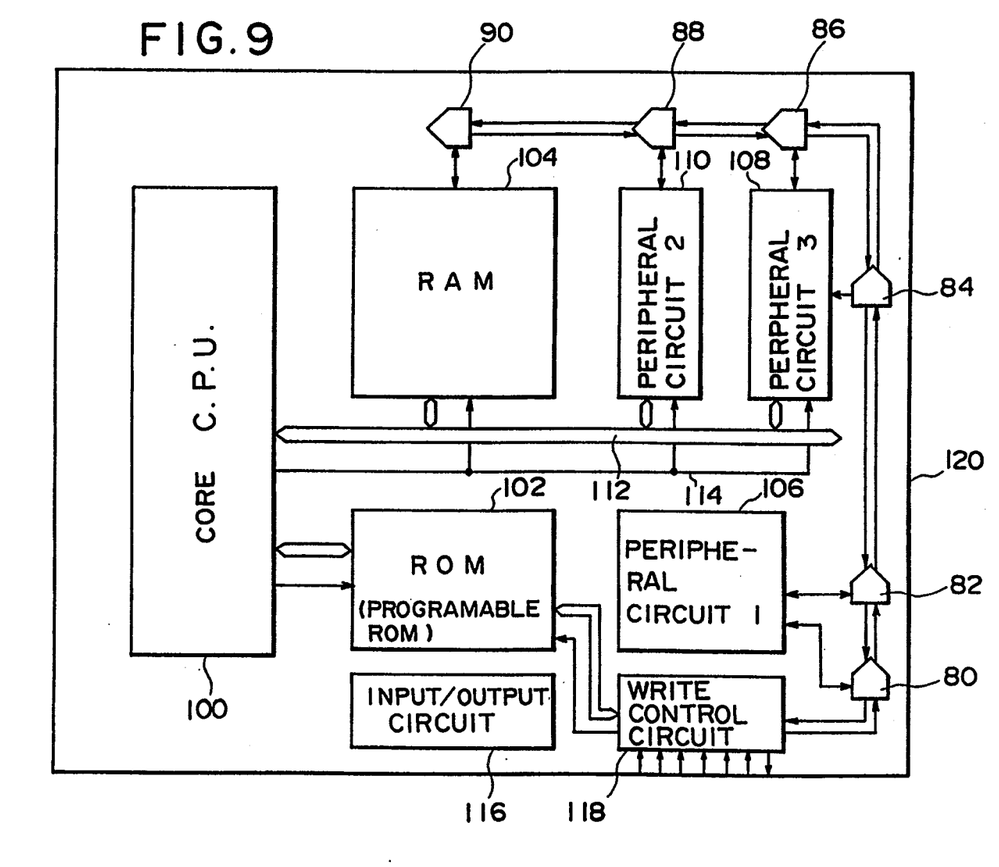
FIG. 9 is a block diagram showing the configuration of a one-chip micro computer as a further embodiment of the present invention.

FIG. 9 is a block diagram showing the configuration of a one-chip micro computer having function changeover switches of the same as described above. In the micro computer of this embodiment, function changeover switches 80, 82, 84, 86, 88, 90, ... of the same as described above are arranged so as to be connected in series. Like a general micro-computer, the micro computer further has a core CPU 100, a PROM 102, an RAM 104 and peripheral circuits 106, 108 and 110. The constituent members of the micro computer are connected to each other through data bus 112 and address bus 114. The micro computer further has an input/output circuit 116 and a write control circuit 118. Particularly, the write control circuit 118 is connected to the function changeover switch 80 and for controlling the function changeover switches 80, 82, 84, 86, 88, 90 ... to perform writing of data and reading of written data. The switching output (A, B1, B2 in FIGS. 1 through 4) of the function changeover switches 80, 82, 84, 86, 88, 90 ... is delivered to the peripheral circuits 106, 108 and 110 and the RAM 104 so that an address, a function and the like are selected in accordance with the switching output. As a result, the core CPU 100 carries out an arithmetic operation in accordance with the selection.

Figure 10:
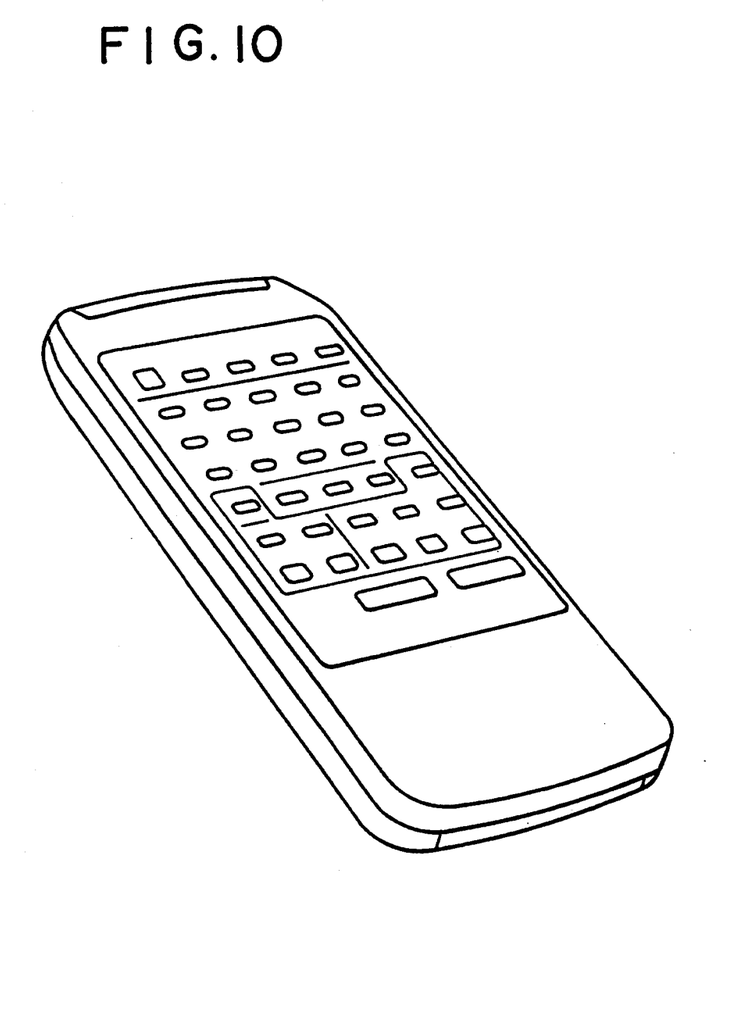
FIG. 10 is a perspective view of a remote controller in which the one-chip micro computer of FIG. 9 is incorporated.

FIG. 10 is a perspective view of a remote controller for an air conditioner as an example of an electronic appliance including the one-chip micro computer of FIG. 9.

What is claimed is:

1. A semiconductor device comprising a nonvolatile storage device which is writable electrically, and a switching circuit which is controlled on the basis of data stored in said nonvolatile storage device to perform wiring switching, wherein said nonvolatile storage device includes a nonvolatile element writable electrically, a stored data output circuit for reading data written in said nonvolatile element in order to check said data, a write control circuit for writing data in said nonvolatile element, and a data holding circuit for reading data written in said nonvolatile element and for holding said data.

2. A semiconductor device according to claim 1, wherein said switching circuit includes at least two transmission gates so that wiring switching is performed by opening one of said transmission gates.

3. A semiconductor device according to claim 1, wherein said switching circuit includes at least two clocked gates so that wiring switching is performed by opening one of said clocked transmission gates.

4. A semiconductor device according to claim 1, wherein said switching circuit includes at least two NAND gates so that wiring switching is performed by opening one of said NAND gates.

5. A semiconductor device according to claim 1, wherein said switching circuit includes at least two NOR gates so that wiring switching is performed by opening one of said NOR gates.

6. A semiconductor device according to claim 1, wherein said semiconductor device further comprises a transfer register for receiving write data as input data and for delivering said data as output data to said nonvolatile storage device in predetermined timing.

7. A semiconductor device comprising a plurality of function changeover switches connected in series, each of said function changeover switches including a transfer register for receiving write data as input data and for sending out said data as output data in predetermined timing, a nonvolatile storage device writable electrically and for storing data received from said transfer register, a switching circuit controlled on the basis of data stored in said nonvolatile storage device to perform wiring switching, and a stored data output circuit for reading data written in said nonvolatile storage device in order to check said data.

8. A semiconductor device according to claim 7, wherein said function changeover switches are provided on a one-chip micro computer, said one-chip micro computer including a read only storage device, a random access storage device, a central processing unit and an input/output circuit which are formed on one semiconductor substrate, so that functions of said one-chip micro computer are switched from one to another by respective changeover operations of said function changeover switches.

9. An electronic appliance comprising a semiconductor device including a plurality of function changeover switches connected in series, each of said function changeover switches having a transfer register for receiving write data as input data and for sending out said data as output data in predetermined timing, a nonvolatile storage device writable electrically and for storing data received from said transfer register, a switching circuit controlled on the basis of data stored in said nonvolatile storage device to perform wiring switching, and a stored data output circuit for reading data written in said nonvolatile storage device in order to check said data.

10. An electronic appliance according to claim 9, wherein said function changeover switches are provided on a one-chip micro computer, said one-chip micro computer including a read only storage device, a random access storage device, a central processing unit and an input/output circuit which are formed on one semiconductor substrate, so that functions of said one-chip micro computer are switched from one to another by respective changeover operations of said function changeover switches.

* * * * *